United States Patent [19]
Takeda

[11] 4,255,700
[45] Mar. 10, 1981

[54] CONTROL CIRCUIT OF REACTIVE POWER COMPENSATION APPARATUS

[75] Inventor: Masatoshi Takeda, Amagasaki, Japan

[73] Assignee: Mitsubishi Denki Kabushiki Kaisha, Tokyo, Japan

[21] Appl. No.: 18,940

[22] Filed: Mar. 9, 1979

[51] Int. Cl.$^3$ .............................................. H02J 3/18
[52] U.S. Cl. .................................................... 323/210
[58] Field of Search ................ 323/101, 119, 127, 128

[56] References Cited

U.S. PATENT DOCUMENTS

| | | | |
|---|---|---|---|
| 3,959,719 | 5/1976 | Espelage | 323/119 X |
| 3,968,422 | 7/1976 | Waldmann | 323/119 X |
| 4,041,370 | 8/1977 | Schröder | 323/119 X |
| 4,068,159 | 1/1978 | Gyugyi | 323/119 |
| 4,172,234 | 10/1979 | Gyugyi et al. | 323/119 |

*Primary Examiner*—A. D. Pellinen
*Attorney, Agent, or Firm*—Oblon, Fisher, Spivak, McClelland & Maier

[57] ABSTRACT

A control circuit of a reactive power compensation apparatus which comprises a reactor and a capacitor are connected in parallel between a power source and a load to perform phase control of current passing through the reactor by a control switching element such as thyristor. The control circuit comprises a device for detecting instantaneous value of load current at a predetermined phase of the power voltage, a multiplier, a subtractor and a divider and a device for generating gate pulse in comparison of the output signal of the divider with the rating function generated in synchronizing to the peak phase of the power voltage.

12 Claims, 14 Drawing Figures

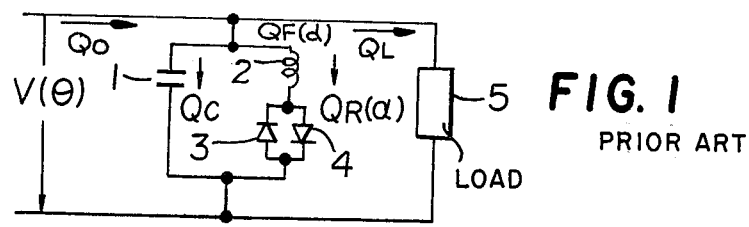
FIG. 1 PRIOR ART
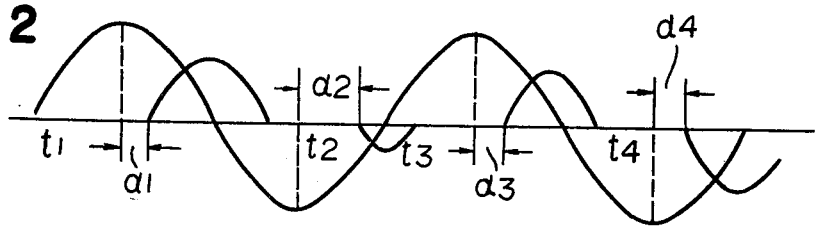
FIG. 2 PRIOR ART
FIG. 3 PRIOR ART
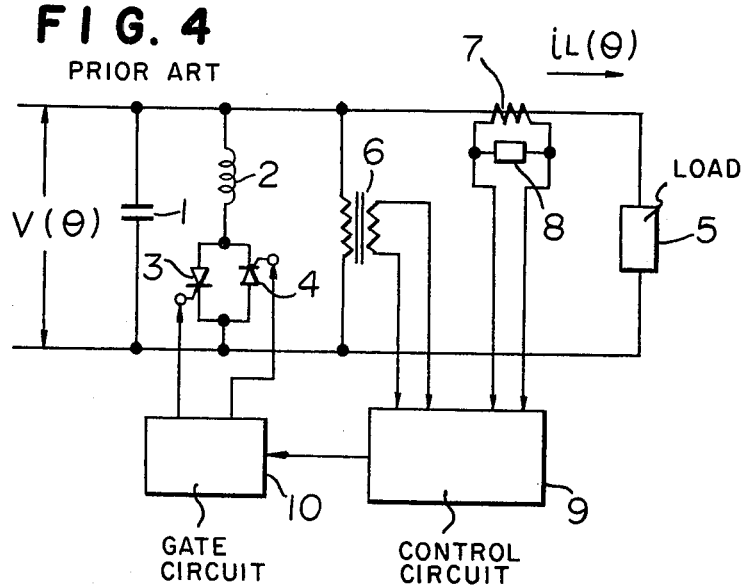

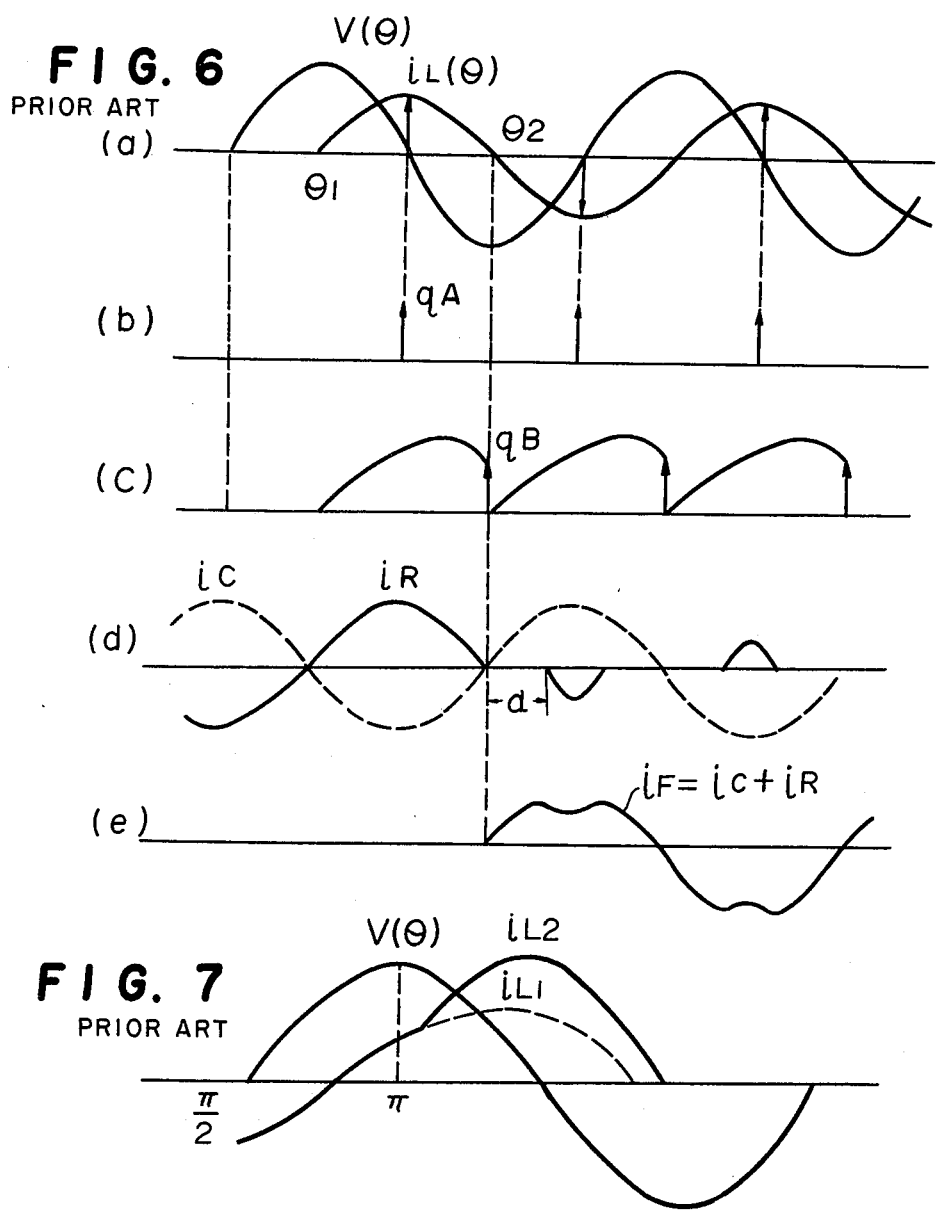

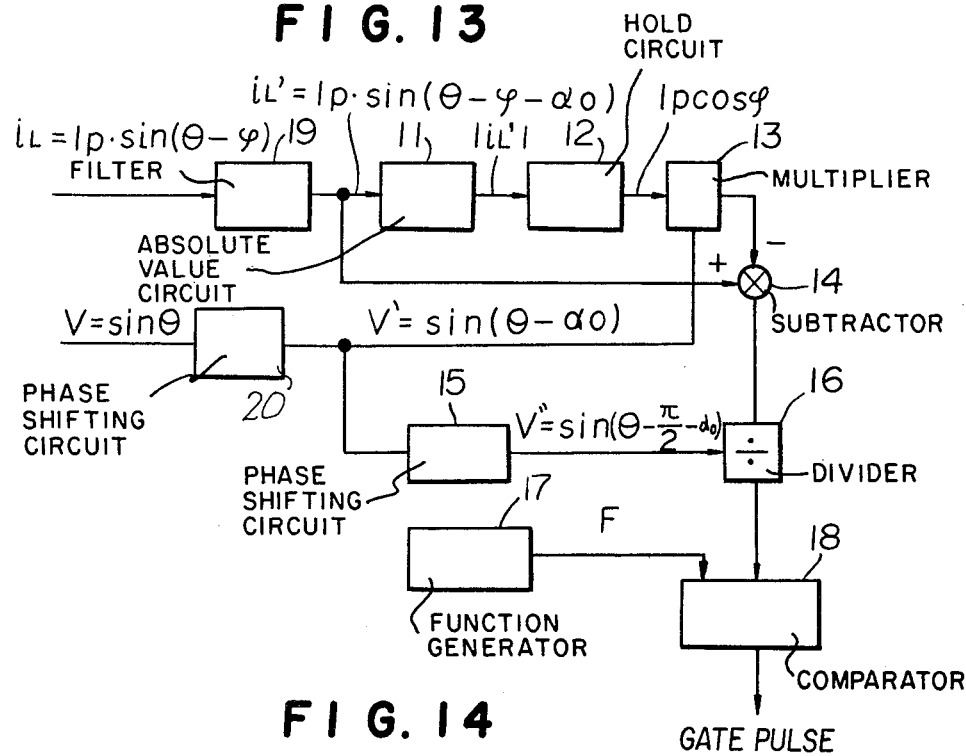
FIG. 13
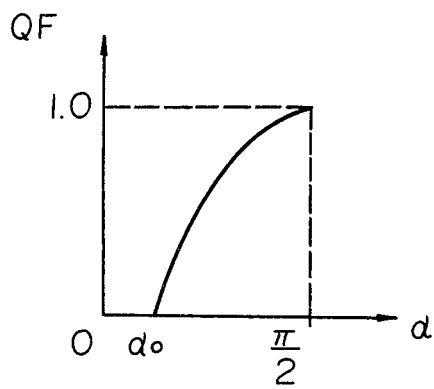
FIG. 14
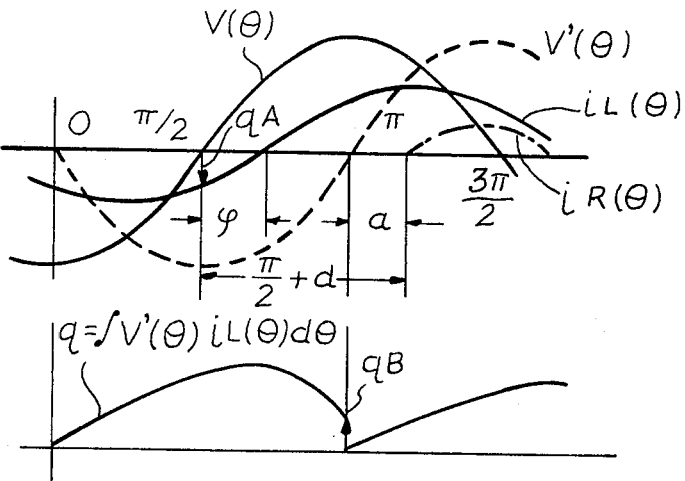
FIG. 5a PRIOR ART
FIG. 5b PRIOR ART

CONTROL CIRCUIT OF REACTIVE POWER COMPENSATION APPARATUS

BACKGROUND OF THE INVENTION

1. Field of the Invention

The present invention relates to a control circuit of a reactive power compensation apparatus for compensating a reactive power of variable load by a combination of a power capacitor and a thyristor control reactor connected in parallel to the variable load in a power system.

2. Description of the Prior Art

When variation of a reactive power is irregular as an arc furnace and variation of the period is fast, it is necessary to increase speed of a response of the compensation apparatus to variation of the reactive power in order to compensate effectively the variation of the reactive power. It is indispensable that the reactive power compensation apparatus comprises a reactive power detection circuit for detecting sudden variation of a reactive power of a load without delay and a gate circuit for determining immediately a turn-on phase angle of a thyristor depending upon the detected reactive power.

FIG. 1 shows a diagram of a main circuit of the conventional reactive power compensation apparatus.

In FIG. 1, the reference numeral (1) designates a leading capacitor having a leading phase reactive power $Q_c$; (2) designates a reactor and phase of the current fed to the reactor (2) is controlled by thyristors (3), (4) connected in series. The lagging reactive power $Q_R$ obtained from the power source by the reactor (2) under the phase control of the thyristors (3), (4) can be varied as desired in the range of 0 to 100%.

FIG. 2 shows currents fed to the reactor (2) and the thyristors (3), (4) by turning on the thyristors (3), (4) at a control angle $\alpha$ to power voltage $V(\theta)$. It is found that effective value of the current is varied depending upon the turn-on phase angle $\alpha$ of the thyristors (3), (4).

FIG. 3 shows relation of the turn-on phase angle $\alpha$ and the reactive power $Q_R$ fed to the reactor (2).

The lagging reactive power $Q_R$ fed to the reactor (2) can be controlled by varying the turn-on phase angles $\alpha$ of the thyristors (3), (4) whereby the leading reactive power can be controlled by combining with the capacitor (1).

For example, when it is considered that the leading reactive power of the capacitor is equal to the maximum lagging reactive power of the reactor (2) in the system of FIG. 1, the composite reactive power fed from the power source is given by the equation:

$$R_F(\alpha) = Q_C - Q_R(\alpha) \qquad (1)$$

wherein $R_F(\alpha)$ designates a reactive power fed to the reactive power compensation apparatus at the turn-on phase angle $\alpha$ of the thyristors (3), (4); $Q_c$ designates a leading reactive power fed to the capacitor (1) and $Q_R(\alpha)$ designates a lagging reactive power fed to the reactor (2) at the turn-on phase angle $\alpha$.

As it is clear from the equation (1), the composite reactive power $Q_R(\alpha)$ fed from the power source can be controlled in the range of 0 to 100% by varying the turn-on phase angle $\alpha$ of the thyristors (3), (4).

As shown in FIG. 3, the relation of $Q_F$ and $\alpha$ can be given by the equation;

$$Q_F(\alpha) = 1 - Q_R(\alpha)$$

wherein $Q_c = Q_R(\alpha=0) = 1.0$ per unit (P.U.). Thus, in the case of varying the lagging reactive power $Q_L$ for the variable load as shown in FIG. 1, the value $Q_L$ is detected and the leading composite reactive power $Q_F(\alpha)$ being equal to the value $Q_L$ is fed from the power source to compensate the reactive power $Q_L$ for the load (5).

It has been well-known that when the reactive power for the load connected to a power system is varied, a terminal voltage for receiving the power is varied depending upon an impedance in the power system especially a reactance. The typical example of the load having large variation of a reactive power is an arc furnace. At the beginning of an operation of the arc furnace, a lagging reactive power having irregular period and fast variation and large width of variation is passed through the system whereby the voltage in the system connecting the arc furnace is seriously varied to cause voltage flicker and various disadvantageous effects such as flicker of light and racing of image of TV receiver are caused.

As a mechanism for controlling effectively such variation of the reactive power, the reactive power conpensation apparatus of FIG. 1 can be used. The reactive power $Q_L$ of the load (5) is detected and the thyristors (3), (4) are turned on at each ½ cycle of the power frequency at the turn-on phase angle $\alpha$ for generating the composite reactive power $Q_F$ which compensates the value $Q_L$ whereby the variation of the load reactive power is compensated or controlled. In such case, it is important to detect the variation of the load reactive power as soon as possible. The compensation effeciency of the reactive power compensation apparatus is determined by the speed for the detection of the variation.

FIG. 4 shows a control circuit of the conventional reactive power compensation apparatus wherein the reference numeral (6) designates a potential transformer for load voltage detection; (7) designates a current transformer for a load current detection; (8) designates a load resistor of the transformer (7) which is provided to obtain a voltage signal proportional to the current; (9) designates a control circuit which detects a load voltage, a load current or a load reactive power corresponding to the load voltage or the load current resulted by the transformer (6), the current transformer (7) and the load resistor (8) to determine the phase angle for turning on the thyristors (3), (4); (10) designates a gate circuit for feeding turn-on pulse to the gates of the thyristors (3), (4) at the turn-on phase angle determined by the control circuit (9).

The parts (1) to (5) are the same with those of FIG. 1 and the description thereof is not repeated.

The operation of the control circuit will be illustrated referring to the signal waveforms in FIG. 5.

The transformer (6) detects the load voltage v ($\theta$) as shown in FIG. 5(a) and the current transformer (7) and the load resistor (8) detect the load current $i_L(\theta)$ as shown in FIG. 5(a). The detected load voltage v($\theta$) and the load current $i_L(\theta)$ are fed to the control circuit (9) which detects the instantaneous load current $i_L(n\pi/2)$ at the load voltage $v(\theta)=0$ $\theta=n\pi/2$, n=1, 2 .... The detected value is shown as $Q_A$ in FIG. 5(a) wherein $q_A$ is given by the equation;

$$q_A = I_p \cdot \sin\phi \qquad (2)$$

wherein the reference φ designates a phase angle of the current $i_L$ at the voltage v and $I_p$ designates the maximum current in ½ cycle.

The load reactive power $Q_L$ is given by the equation;
$$Q_L = VI_p \sin \phi$$

The variation of the voltage is quite small. When the voltage is considered to be constant, the load reactive power $Q_L$ is proportional to $I_p \sin \phi$ and accordingly, the detected value $q_A$ of the control circuit (9) is proportional to the load reactive power $Q_L$. Thus, the control circuit (9) detects the value $q_A$ at $\theta = \pi/2$ as shown in FIG. 5(a) and the control angle α for generating the composite reactive power for compensation corresponding to the value $q_A$ is determined. The gate circuit (10) feeds the turn-on pulse to the thyristor (3) at $0 = \pi + \alpha$.

The turn-on pulse is also fed to the thyristor (4) in the same principle. The description is not repeated.

There is the other method of detecting the reactive power value $q_B$ in the range of $0 \leq \theta \leq \pi$ or $\pi \leq 0 \leq 2\pi$ as shown in FIG. 5(b) as the other detection of the control circuit (9).

The control circuit (9) forms a voltage $v'(\theta)$ lagging for 90 degree to the output signal $v(\theta)$ of the transformer (6) as shown in FIG. 5(b), and the following operations are performed in each of said sections;

$$q = \int v'(\theta) \times i_L(\theta) \, d\theta \qquad (3)$$

The equation (3) is calculated depending upon the definition of the reactive power. The value $q(n\pi) = q_B$ at $\theta = n\pi$, $n = 1,2,3...$ is proportional to the reactive power in ½ cycle. Thus, the control circuit (9) detects the value $q_B$ at $\theta = n\pi$ to determine the phase angle α for turning on the thyristor for generating compensation capacity corresponding to the detected value $q_B$.

As shown in FIG. 5(a), the gate circuit (10) applies the turn-on pulse to the thyristor (3) at $\theta = \pi + \alpha$ whereby the reactive power $Q_L$ of the load (5) is compensated or controlled.

The dotted chain line in FIG. 5(a) shows the current $i_R(\theta)$ passing through the thyristor (3).

In this method, the thyristor (4) is also turned on at suitable phase angle α in the same principle. The description is not repeated.

As it is clear from the above-mentioned description, in the conventional control circuit, there is a waste time from the detection of the load reactive power $Q_L$ and the compensation by the turn-on of the thyristor. The reactive power value in the last ½ cycle is compensated in the present ½ cycle. The ½ cycle lagging control is performed.

When the load current $i_L(\theta)$ which has been 0 at $\theta_1$ is suddenly increased in a phase difference of 90 degree to the load voltage $v(\theta)$ as shown in FIG. 6(a), the current in the last ½ cycle could not be detected and it is compensated in the next ½ cycle whereby the current in the last ½ cycle is remained.

This fact will be illustrated referring to the signal waveforms in FIG. 6. The detected value $q_A$ in the detection of FIG. 5(a) is shown in FIG. 6(b). The detected value $q_B$ in the detection of FIG. 5(b) is shown in FIG. 6(c).

In both cases, the reactive power in the term from $\theta_1$ to $\theta_2$ is detected to control the reactor current $i_R$ after $\theta_2$. The reactor current $i_R$ is given as shown in FIG. 6(d). That is, the reactor current is equal to the capacitor current $i_c$ before $\theta_2$ and the composite compensation current $i_F$ is zero as shown in FIG. 6(e). After $\theta_2$, the values $q_A$ or $Q_B$ is detected to control the reactor current at the control angle α as the same with that shown in FIG. 6(d), whereby the compensation current $i_F$ starts after $\theta_2$ to compensate the load current $i_L(\theta)$ as shown in FIG. 6(e).

As it is clear from the above-mentioned fact, in the conventional control system, the compensation is started after $\theta_2$ even though the load current is passed from $\theta_1$. The compensation is started in lagging for ½ cycle. Therefore, the compensation for the first ½ cycle could not be performed to cause a compensation error.

When the load is seriously variated as an arc furnace, such current variation is repeated. In the conventional control circuit, the error caused by lagging the compensation can not be negligible and the compensation effect is inferior.

The thyristors (3), (4) are turned on at $\theta = \pi + \alpha$ by the reactive power detected at $\theta = \pi$.

Even though sudden change of the current is caused after $\theta = \pi$ as shown in FIG. 7, the detection of the reactive power has been finished whereby the sudden change of the current could not be detected. Therefore, the compensation apparatus compensates in the estimation that the load current has the waveform $i_{L1}$ shown in FIG. 7. However, the waveform of the current which should be compensated is the waveform $i_{L2}$ shown in FIG. 7 whereby a compensation error for the difference between $i_{L1}$ and $i_{L2}$ is caused to deteriorate the compensation effect.

SUMMARY OF THE INVENTION

The present invention is to overcome said disadvantages and to provide a control circuit of a reactive power compensation apparatus which minimizes a lagging time for the control from the detection of the reactive power to the compensation.

The foregoing and other objects have been attained by providing a control circuit of a reactive power compensation apparatus which comprises means for detecting instantaneous value of load current at a predetermined phase of the power voltage, multiplier, a subtractor and a divider and means for generating gate pulse in comparison of the output signal of the divider with the rating function generated in synchronizing to the peak phase of the power voltage wherein a reactor and a capacitor are connected in parallel between a power source and a load to perform phase control of current passing through the reactor by a control switching element such as thyristor.

BRIEF DESCRIPTION OF THE DRAWINGS

FIG. 1 is a circuit diagram of a main circuit of a reactive power compensation apparatus;

FIG. 2 is a signal waveform for illustrating a relation of a current and a turn-on angle of a thyristor of the reactive power compensation apparatus;

FIG. 3 is a characteristic diagram for illustrating relation of a turn-on angle of a thyristor of the reactive power compensation apparatus and a compensation reactive power;

FIG. 4 is a circuit diagram of a control circuit of the conventional reactive power compensation apparatus;

FIG. 5 is a signal waveform diagram for illustrating the operation of the control circuit of the conventional reactive power compensation apparatus;

FIG. 6 is a signal waveform diagram for illustrating the response of the control circuit of the conventional reactive power compensation apparatus;

FIG. 7 is a signal waveform diagram showing dependency to variation of waveform in the control circuit of the conventional reactive power compensation apparatus;

FIG. 13 is a block diagram of the other embodiment of the present invention; and FIG. 14 is a signal waveform diagram for illustrating function generated by a functional generator shown in FIG. 13.

Referring to FIGS. 8 to 14, embodiments of the present invention will be illustrated.

FIG. 8 shows a principle of the detection of the reactive power in a control circuit of the present invention;

In FIG. 8, the reference v designates a power voltage; $i_L$ designates a load current, which can be divided into an active current component $i_1$ and a reactive current component $i_2$. The active current component $i_1$ has the same phase with that the power voltage v and the peak value thereof is equal to an instantaneous value of the load current $i_L$ in a peak phase $\pi/2$ of the power source voltage v. The reactive current component $i_2$ has a phase difference of 90 degree to the power source voltage v and the peak value thereof is equal to an instantaneous value $i_L$ at the phase $\pi$ for the power source voltage v of zero.

The fact is shown by the equation:

$$i_L = I_p \cdot \sin(\theta - \phi) \quad (4)$$

$$i_1 = I_p \cdot \cos\phi \cdot \sin\theta \quad (5)$$

$$i_2 = I_p \cdot \sin\phi \cdot \sin(\theta - \pi/2) \quad (6)$$

As it is clear from the equation (6), the reactive power of the load current $i_L$ is proportional to $I_p \sin\phi$, it is enough to detect the peak value $I_p \sin\phi$ of the reactive current component $i_2$ in order to detect the reactive power of the load current $i_L$.

The reactive current component $i_2$ is shown by $i_L - i_1$. When the active current component $i_1$ is found, the reactive current component $i_2$ can be calculated.

The active current component $i_1$ is shown by a sine wave in the same phase with that of the power voltage v having the instantaneous value of the load current $i_L$ at $\theta = \pi/2$ as the peak value. Therefore, the active current component $i_1$ after $\theta = \pi/2$ can be estimated. The reactive current component $i_2$ can be detected by determining a difference between the estimated active current component $i_1$ and the load current $i_L$.

The peak value of the reactive current component $i_2$ can be given by the equation (6) as follows.

$$I_p \cdot \sin\phi = \frac{i_2}{\sin(\theta - \pi/2)} \quad (7)$$

The peak value can be calculated by a ratio of instantaneous values of the reactive current component $i_2$ at times after $\theta = \pi/2$ and the value of $\sin(\theta - \pi/2)$ at the times.

Figure 8:
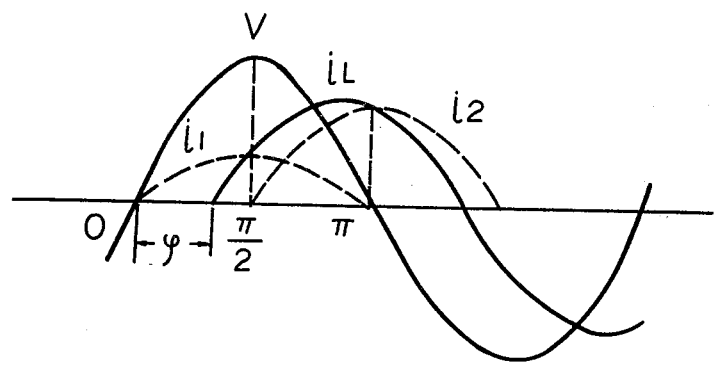
FIG. 8 is a signal waveform diagram for illustrating a principle of the present invention.
Figure 9:
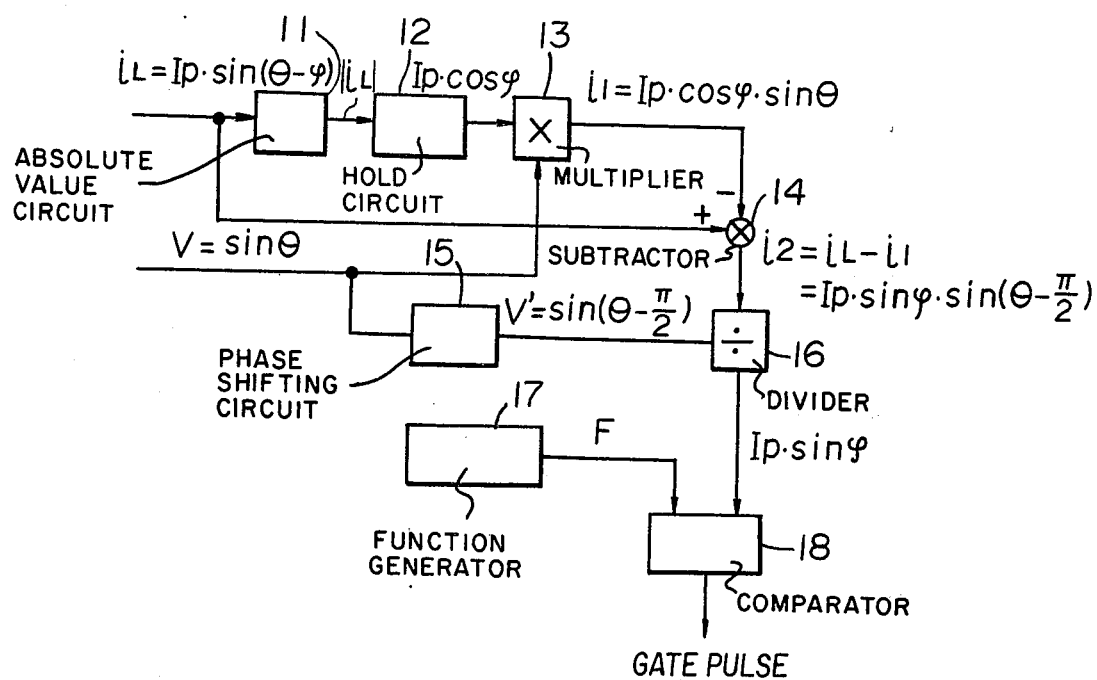
FIG. 9 is a block diagram of one embodiment of the present invention.

FIG. 9 shows one embodiment of the present invention wherein the reference numeral (11) designates an absolute value circuit for detecting an absolute value of the load current; (12) designates a hold circuit for holding the instantaneous value of the load current for a predetermined term at the peak phase of the power source; (13) designates a multiplier for multiplying the output of the hold circuit (12) to the power voltage; (14) designates a subtractor for subtracting the output of the multiplier (13) from the load current; (15) designates a phase shifting circuit for lagging the power voltage for a predetermined phase; (16) designates a divider for dividing the output of the subtractor (14) by the output of the phase shifting circuit (15); (17) designates a function generator for generating a predetermined function from the peak phase of the power voltage; (18) designates a comparator for comparing the output of the divider (16) with the output of the function generator (17).

Figure 10:
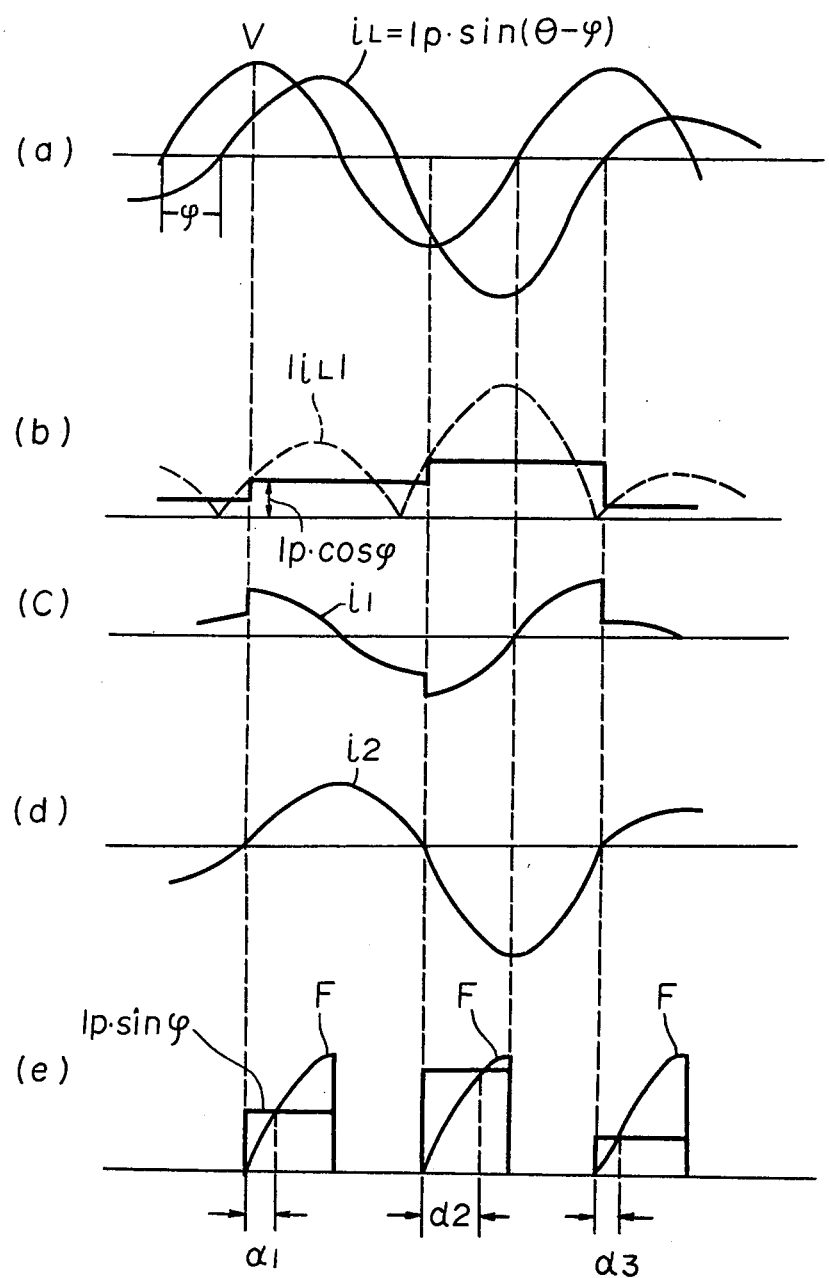
FIG. 10 is a signal waveform for illustrating the operation of the embodiment of FIG. 9.

The operation of the control circuit will be illustrated depending upon the signal waveform of FIG. 10.

When the load current of $i_L = I_p \cdot \sin(\theta - \phi)$ as shown in FIG. 10(a) is fed to the absolute circuit (11), the absolute value circuit (11) detects the absolute value $|i_L|$ of the load current as shown by the broken line of FIG. 10(b) and the absolute value $|i_L|$ of the detected load current is fed to the hold circuit (12) to hold the instantaneous value $I_p \cos\phi$ of the absolute value $|L|$ at the peak phase of the power voltage v as shown by the full line in FIG. 10(b). The hold circuit (12) holds the instantaneous value of the absolute value $|i_L|$ at the peak phase of the voltage for ½ cycle. In the next peak phase of the voltage, it newly holds the instantaneous value of the absolute value $|i_L|$ at the phase. The output of the load circuit (12) is fed to the next step multiplier (13) wherein the power voltage $v = \sin\theta$ used as the sine wave function is multiplied to the output $I_p \cdot \cos\phi$ of the hold circuit (12) whereby the active current component $i_1 = I_p \cos\phi \sin\theta$ as shown in FIG. 10(c) can be obtained at the output side of the multiplier (13). The active current component $i_1$ is fed to the subtractor (14) wherein it is subtracted from the load current $i_L$. That is, the reactive current component $i_2$ is given from the equations (4) to (6) as follows.

$$i_2 = i_L - i_1 = I_p \cdot \sin\phi \cdot \sin(\theta - \pi/2) \quad (8)$$

The reactive current component $i_2$ as shown in FIG. 10(d) is given at the output side of the subtractor (14) and the component $i_2$ is fed to the divider (16) in the next step. On the other hand, the power voltage $v = \sin\theta$ is changed to $v' = \sin(\theta - \pi/2)$ by lagging for a predetermined phase such as 90 degree by the phase shifting circuit (15).

The lagged power source voltage v' is fed to the divider (16) wherein the reactive current component $i_2$ is divided by the equation;

$$\frac{i_2}{v'} = \frac{I_p \cdot \sin\phi \cdot \sin(\theta - \pi/2)}{\sin(\theta - \pi/2)} = I_p \cdot \sin\phi \quad (9)$$

At the output side of the divider (16), the peak value $I_p \cdot \sin\phi$ of the reactive current component of the load current $I_L$ as shown in FIG. 10(e) is obtained. The peak value $I_p \cdot \sin \phi$ is fed to the comparator (18) in the next step.

The comparator (18) receives the output of the function generator (17) for generating the function of the rating function F at the peak phase of the power voltage v such as $\theta = \pi/2$ as shown in FIG. 10(e). The rating function F generated from the function generator (17) is given by the relation of the control angle $\alpha$ of the thyristor and the leading reactive power $Q_F$ generated by the reactive power control apparatus comprising the capacitor (1), the reactor (2) and the thyristors (3), (4). The comparator (18) compares the output $I_p \cdot \sin \phi$ of the divider (16) with the output F of the function generator (17), and it generates gate pulses to turn on the thyristor (3) or (4) at the turn-on phase angles $\alpha_1$, $\alpha_2$ and $\alpha_3$ wherein these values are equal as shown in FIG. 10(e).

Figure 11:
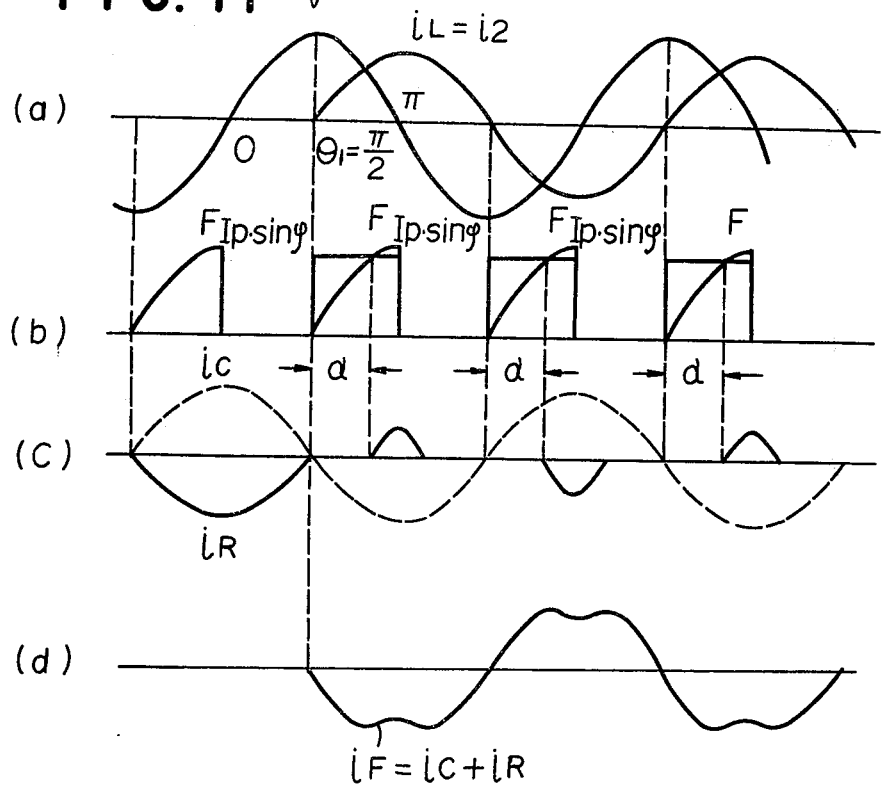
FIG. 11 is a signal waveform diagram for illustrating a response of the embodiment of the present invention.
Figure 12:
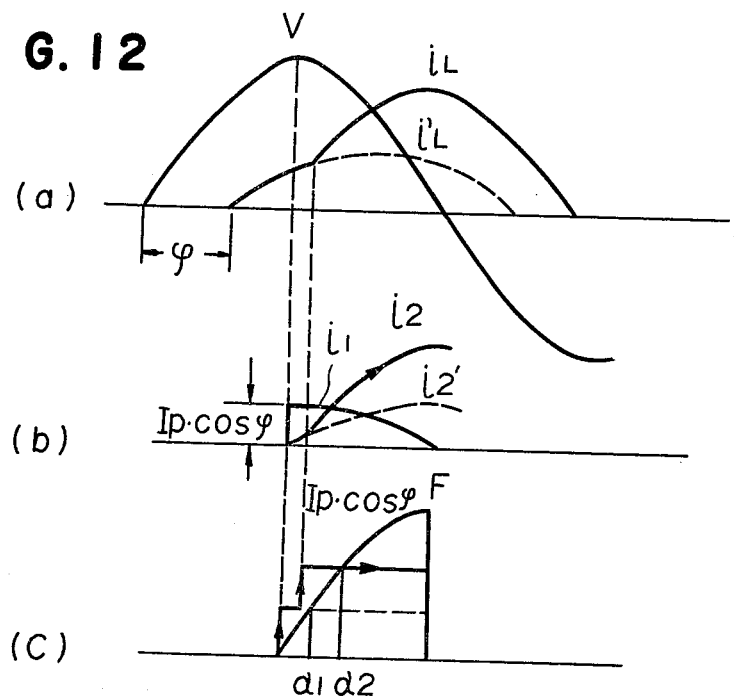
FIG. 12 is a signal waveform diagram for showing a dependency to variation of waveform in the embodiment of the present invention.

The feature of the control circuit of the present invention will be further illustrated referring to FIGS. 11 and 12.

Firstly, the control circuit of the present invention has superior response to sudden variation of the current in comparison with that of the conventional control system. For example, the superiority of the temperature response in the case of sudden passing of a load current from $\theta_1 = \pi/2$ from no current pass as shown in FIG. 11 will be illustrated by referring to FIG. 6 showing the operation characteristic of the conventional apparatus.

In FIG. 11(a), the load current is not passed before $\theta_1$, whereby the thyristor (3) or (4) is turned on at $\alpha = 0°$ and the current $i_R$ passing through the reactor (2) is equal to the current $i_C$ passing through the capacitor (1) and the leading reactive power passing to the reactive power compensation apparatus is zero as shown in FIG. 11(c). When the load current $i_L = I_p \cdot \sin(\theta - \pi/2)$ begins to pass after $\theta_1$, the active current component $i_1 = I_p \cdot \cos \phi \cdot \sin \theta$ is generated at $\theta_1$ of the peak phase of the voltage v depending upon the control circuit of FIG. 9. In this case, $i_1 = 0$ is given because of $\phi = \pi/2$. Therefore, $i_2 = i_L$ is given to detect the peak value $I_p \cdot \sin \phi$ of the reactive current component immediately after $\theta_1$ as shown in FIG. 11(b) whereby the gate pulse is generated at the turn-on phase angle $\alpha$ as the cross point of the rating function F and the peak value $I_p \cdot \sin \phi$ of the reactive current component and accordingly, the thyristor (3) or (4) is turned on. The current $i_R$ passed through the reactor (2) is reduced immediately after $\theta_1$ and the leading reactive current $i_F$ for compensating the reactive component of the load current $i_L$ is fed to the reactive power compensation apparatus as shown in FIG. 11(d) whereby it can response to the variation of the load current $i_L$ without any delay. Therefore, it is clear that the response of the control circuit of the present invention is remarkably superior to that of the conventional control system, wherein the response of the leading reactive current $i_F$ is delayed for $\frac{1}{2}$ cycle to the variation of the load current $i_L$ as shown in FIG. 6(e).

Secondly, when the load current $i'_L$ is increased as the load current $i_L$ by deviating from the sine waveform in the $\frac{1}{2}$ cycle as shown in FIG. 12(a), the reactive power of the load is increased whereby it is necessary to increase corresponding to the compensation reactive power. The control circuit of the present invention has superior dependency to such waveform which could not be found in the conventional control circuit. That is, as shown in FIG. 12(b), the reactive current component $i_2$ is increased depending upon the load current $i_L$ to the current waveform of FIG. 12(a). The output $I_p \cdot \sin \phi$ of the divider (16) is not constant, and as shown in FIG. 12(c), it is changed to the increasing direction to shift backwardly, the point crossing to the function F. Thus, when the load current $i_L$ is not changed, the thyristor (3) or (4) is turned on at $\alpha_2$ instead of $\alpha_1$ of FIG. 12(c) whereby the compensation reactive power is increased depending upon the increase of the reactive power of the load to reduce the compensation error.

On the contrary, when the load current $i_L$ is decreased by deviating from the sine waveform, the compensation reactive power can be decreased depending upon the decrease of the reactive power of the load to reduce the compensation error in the reverse condition.

FIG. 13 shows the other embodiment of the present invention wherein a filter (19) for current distortion elimination is connected front of the absolute value circuit (11) and a shifting circuit (20) for lagging the power voltage for an angle equal to the lagging angle of the filter is connected to the line for feeding the power voltage.

In general, the current of the load as an arc furnace is not complete sine waveform to contain distortion. Such current waveform can be eliminated by connecting a filter (19) front of the absolute value circuit (11). The filter (19) is a primary lag circuit whose gain is reduced depending upon the increase of frequency. The phase of current passed through the filter (19) is shifted as $\alpha_0$. The value $\alpha_0$ should be less than $\pi/2$ and preferably 20 to 30 degree. Therefore, the instantaneous value of $|i_L|$ of the hold circuit is held at the phase of $\theta = \pi/2 + \alpha_0$. The phase of the power voltage v is lagged for $\alpha_0$ degree at the phase shifting circuit (20) in order to conform the phase of the power voltage v with that of the load current $i_L$. The other operation is the same with that of the circuit of FIG. 9 and it is not repeated.

The function F generated by the function generator (17) is selected so that the minimum turn-on phase angle is $\alpha_0$ as shown in FIG. 14.

As it is clear from the description, in accordance with the present invention, the instantaneous value of the load current at the predetermined phase of the power voltage is detected and the instantaneous value is multiplied to the sine wave having the same or predetermined phase to that of the power voltage and the resulted value is subtracted from the load current and the subtracted value is divided by a sine wave having a phase difference for the predetermined phase difference of 90° or 90° + to that of the power voltage and the gate pulse is generated when the divided value is equal to the rating function whereby the control delay time from the detection of the reactive power to the compensation can be minimized and the control circuit of the reactive power compensation apparatus having excellent compensation effect can be obtained.

What is claimed is:
1. In a control circuit for a reactive power compensation apparatus including a reactor and a capacitor connected in parallel between a power source and a load to perform phase control of current passing through said reactor by means of a control switching element coupled in series with said reactor, an improvement comprising:
   means for detecting the instantaneous value of a load current waveform passing through said load at a predetermined phase angle of the source voltage waveform supplied by said power source;

multiplier means coupled to the output of said detecting means for multiplying said detected instantaneous value of said load current with a first sine wave, said first sine wave being related to said source voltage waveform by a first phase difference;

subtractor means coupled to receive the output of said multiplier means and said load current waveform, said subtractor means subtracting said output of said multiplier means from said load current waveform;

divider means coupled to the output of said subtractor means for dividing the output of said subtractor means by a second sine wave, said second sine wave being related to said source voltage waveform by a second phase difference; and generator means coupled to the output of said divider means for generating a gate pulse for said control switching element, said generator means performing a comparison between the output of said divider means and a rating function generated in synchronism with the peak value of said source voltage waveform.

2. A control circuit for a reactive power compensation apparatus as recited in claim 1, wherein said detecting means comprises:

absolute value circuit means coupled to receive said load current waveform for developing an output signal which represents the absolute value of said load current waveform; and holding circuit means coupled to the output of said absolute value circuit means for sampling the absolute value of said load current waveform at said predetermined phase angle of said source voltage waveform and for holding said sample.

3. A control circuit for a reactive power compensation apparatus as recited in claim 2, wherein:

said predetermined phase angle of said source voltage waveform is the phase angle at which the peak value of said source voltage waveform occurs.

4. A control circuit according to claim 2 wherein the first phase difference is zero degrees.

5. A control circuit according to claim 2 wherein the second phase difference is 90 degree.

6. A control circuit for a reactive power compensation apparatus as recited in claim 1, wherein said detecting means comprises:

filter means coupled to receive said load current waveform for filtering said waveform;

absolute value circuit means coupled to receive said filtered load current waveform output of said filter means for developing an output signal which represents the absolute value of said load current waveform; and holding circuit means coupled to the output of said absolute value circuit means for sampling the absolute value of said filtered load current waveform at said predetermined phase angle of said source voltage waveform and for holding said sample.

7. A control circuit for a reactive power compensation apparatus as recited in claim 6, wherein:

said predetermined phase angle of said source voltage waveform is a third phase angle, said third phase angle being phase shifted by a lagging phase angle of said filter means from the phase angle at which the peak value of said source voltage waveform occurs.

8. A control circuit according to claim 6 wherein the first phase difference is equal to the lagging angle of the filter means.

9. A control circuit according to claim 6 wherein the second phase difference is a sum of 90 degree and a lagging angle of the filter means.

10. A control circuit according to claim 6 wherein the filter means is a primary lagging circuit.

11. A control circuit for a reactive power compensation apparatus as recited in claim 1, wherein said generator means comprises:

comparator means coupled to receive the output of said divider means; and function generator means coupled to an input of said comparator means for generating said rating function in synchronism with said peak value of said source voltage waveform.

12. A control circuit according to claim 11 wherein the gate pulse is generated when the output signal of the divider means corresponds to the rating function.

* * * * *